(12) United States Patent
Sung et al.

(10) Patent No.: US 11,804,474 B2
(45) Date of Patent: Oct. 31, 2023

(54) STACK PACKAGES AND METHODS OF MANUFACTURING THE SAME

(71) Applicant: SK hynix Inc., Icheon-si (KR)

(72) Inventors: Ki Jun Sung, Icheon-si (KR); Chae Sung Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 22 days.

(21) Appl. No.: 17/469,281

(22) Filed: Sep. 8, 2021

(65) Prior Publication Data

US 2022/0293564 A1 Sep. 15, 2022

(30) Foreign Application Priority Data

Mar. 9, 2021 (KR) .................. 10-2021-0031082

(51) Int. Cl.
*H01L 25/065* (2023.01)
*H01L 23/31* (2006.01)
*H01L 23/00* (2006.01)
*H01L 25/00* (2006.01)

(52) U.S. Cl.
CPC ...... *H01L 25/0657* (2013.01); *H01L 23/3107* (2013.01); *H01L 24/19* (2013.01); *H01L 24/20* (2013.01); *H01L 25/50* (2013.01); *H01L 2225/06548* (2013.01); *H01L 2225/06562* (2013.01)

(58) Field of Classification Search
CPC . H01L 25/0657; H01L 25/50; H01L 23/3107; H01L 24/19; H01L 24/20; H01L 2225/06548; H01L 2225/06562; H10B 80/00
See application file for complete search history.

(56) References Cited

U.S. PATENT DOCUMENTS

| | | | | |
|---|---|---|---|---|
| 2017/0373041 | A1* | 12/2017 | Kim | H01L 24/32 |
| 2018/0211936 | A1* | 7/2018 | Chang | H01L 24/96 |
| 2019/0074261 | A1 | 3/2019 | Yu et al. | |
| 2020/0075551 | A1* | 3/2020 | Oh | H01L 24/17 |

FOREIGN PATENT DOCUMENTS

KR 1020110077952 A 7/2011

* cited by examiner

*Primary Examiner* — Timor Karimy
(74) *Attorney, Agent, or Firm* — WILLIAM PARK & ASSOCIATES LTD.

(57) ABSTRACT

A stack package, and a method of manufacturing the same, includes a first encapsulant layer formed on a carrier. Also semiconductor dies are sequentially offset stacked on the first encapsulant layer. Vertical connectors connected to the semiconductor dies are formed. A second encapsulant layer coupled to the first encapsulant layer is formed to encapsulate the vertical connectors and the semiconductor dies. Redistribution layers connected to the vertical connectors are formed on the second encapsulant layer.

8 Claims, 22 Drawing Sheets

STACK PACKAGES AND METHODS OF MANUFACTURING THE SAME

CROSS-REFERENCE TO RELATED APPLICATION

The present application claims priority under 35 U.S.C. 119(a) to Korean Application No. 10-2021-0031082, filed on Mar. 9, 2021, which is incorporated herein by reference in its entirety.

BACKGROUND

1. Technical Field

The present disclosure generally relates to a semiconductor package technology and, more particularly, to stack packages and methods of manufacturing the same.

2. Related Art

Semiconductor packages are required to have high density and high performance. Various attempts have been made to integrate a plurality of semiconductor dies into a single semiconductor package structure. Such a semiconductor package is expected to perform a high-speed operation, a large-capacity data processing operation, or a multifunctional operation. In order for the semiconductor package to be suitable for application to mobile devices, a semiconductor package structure having a smaller form factor is required. Various attempts have been made to package structures having a small width and a thin thickness. Structures in which a plurality of semiconductor dies are stacked substantially perpendicular to each other are being attempted.

SUMMARY

According to an embodiment, a method of manufacturing a semiconductor package may include forming a first encapsulant layer on a carrier; sequentially offset stacking semiconductor dies on the first encapsulant layer; forming vertical connectors connected to the semiconductor dies; forming a second encapsulant layer connected to the first encapsulant layer and encapsulating the vertical connectors and the semiconductor dies; and forming redistribution layers connected to the vertical connectors on the second encapsulant layer.

According to another embodiment, a semiconductor package may include semiconductor dies offset stacked on a first encapsulant layer; a second encapsulant layer coupled to the first encapsulant layer and encapsulating the semiconductor dies; redistribution layers formed on the second encapsulant layer; and vertical connectors penetrating the second encapsulant layer and connecting the semiconductor dies to the redistribution layers.

DETAILED DESCRIPTION

Figure 1:
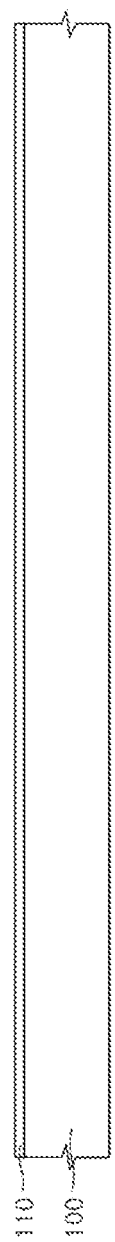
FIGS. 1 to 14 are schematic cross-sectional views illustrating a stack package and a method of fabricating the same according to an embodiment of the present disclosure.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first" and "second," "side," "top," and "bottom or lower" may be used herein to describe various devices, these devices should not be limited by these terms. These terms are only used to distinguish one device from another device, but not used to indicate a particular sequence or number of devices.

A semiconductor device may include a semiconductor substrate or a structure in which a plurality of semiconductor substrates are stacked. The semiconductor device may be a semiconductor package structure in which semiconductor substrates are stacked. The semiconductor substrate may be a semiconductor wafer, a semiconductor die, or a semiconductor chip in which electronic components and devices are integrated. The semiconductor chip may represent memory chips in which memory integrated circuits such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processor such as application processors (Aps), graphic processing units (GPUs), central processing units (CPUs) or system-on-chips (SoCs). The semiconductor devices may be employed in information communication systems such as mobile phones, electronic systems associated with biotechnology or health care, or wearable electronic systems. The semiconductor packages may be applicable to internet of things (IoT).

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be described with reference to other drawings.

FIGS. 1 to 14 are schematic cross-sectional views illustrating process steps of a method of manufacturing a stack package according to an embodiment of the present disclosure.

FIG. 1 is a schematic cross-sectional view illustrating a carrier 100 introduced in the method of manufacturing the stack package according to an embodiment of the present disclosure.

Referring to FIG. 1, the process steps for manufacturing the stack package according to an embodiment may be performed on the carrier 100. The carrier 100 may function as a work table, a handling wafer, or a supporting substrate. The carrier 100 may be made of a hard material. The carrier 100 may be made of a glass material, a silicon (Si) material, or a metal material. The carrier 100 may have a shape of a semiconductor wafer. A carrier adhesive layer 110 may be provided on a surface of the carrier 100. The carrier adhesive layer 110 may include an adhesive for attaching other members to the carrier 100.

Figure 2:
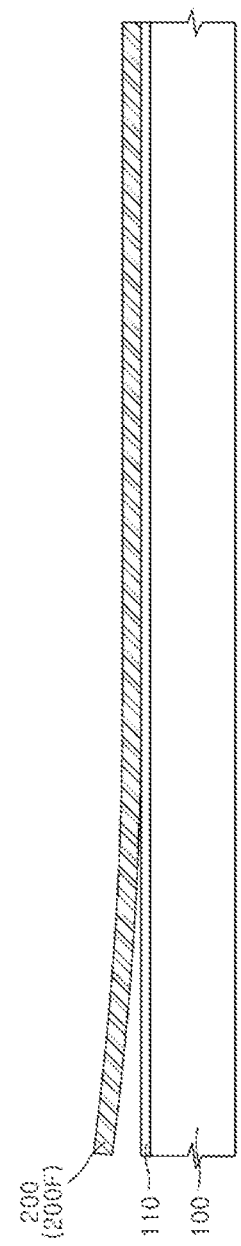
Figure 3:
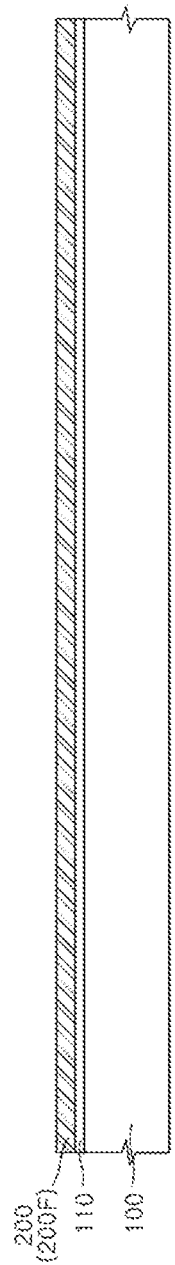

FIGS. 2 and 3 are cross-sectional views illustrating a step of forming a first encapsulant layer 200 of the stack package according to an embodiment of the present disclosure.

Referring to FIGS. 2 and 3, the first encapsulant layer 200 may be formed on the carrier 100. A first encapsulant film 200F may be laminated on the carrier 100 as illustrated in FIG. 2 to form the first encapsulant layer 200 on the carrier 100 as illustrated in FIG. 3. A carrier adhesive layer 110 may attach the first encapsulant film 200F to the carrier 100. The first encapsulant layer 200 may have a thickness of approximately several micrometers (μm) to tens of μm.

The first encapsulant film 200F may be a member in which various encapsulant materials are processed in a form of a film. The encapsulant material may include various types of fillers and resins and may be a material constituting a protective layer that protects semiconductor dies from an external environment in a semiconductor package. The first encapsulant film 200F may include an epoxy molding compound (EMC) film obtained by processing an epoxy molding compound (EMC) into a film form.

Figure 4:
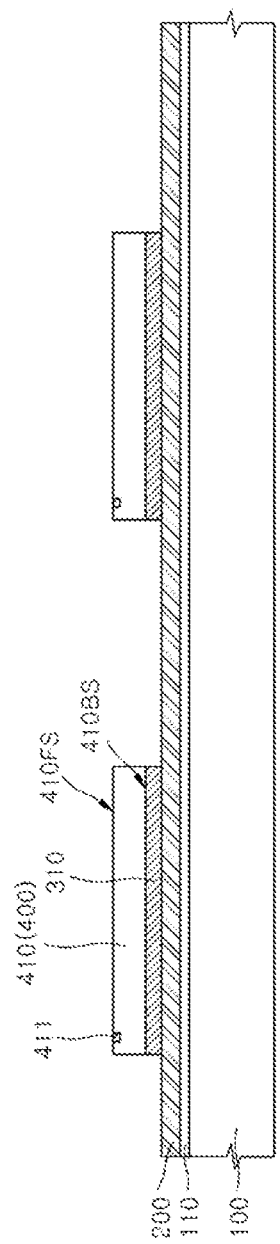

FIG. 4 is a schematic cross-sectional view illustrating a step of disposing lower semiconductor dies 410 of the stack package according to an embodiment of the present disclosure.

Referring to FIG. 4, the lower semiconductor dies 410 may be disposed on the first encapsulant layer 200. The plurality of the lower semiconductor dies 410 may be disposed on the first encapsulant layer 200 while being substantially spaced apart from each other in a horizontal direction. Each of the lower semiconductor dies 410 may be one of the semiconductor dies 400 stacked on the first encapsulant layer 200. Each of the semiconductor dies 400 may be a semiconductor die in which a memory device is integrated.

Each of the lower semiconductor dies 410 may be attached to the first encapsulant layer 200 by a first adhesive layer 310. The first adhesive layer 310 may be coated on a first surface 410BS, which is the back side of the lower semiconductor die 410, so that the first adhesive layer 310 may adhere the lower semiconductor die 410 to the first encapsulant layer 200 while the lower semiconductor die 410 is disposed on the first encapsulant layer 200. The first encapsulant film (200F in FIG. 2) constituting the first encapsulant layer 200 might not contain an adhesive, so that the first adhesive layer 310 may be used when mounting the lower semiconductor die 410 to the first encapsulant layer 200.

Each of the lower semiconductor dies 410 may include a first contact pad 411 on a second surface 410FS. The first contact pad 411 may constitute a connection terminal electrically and signally connected to the lower semiconductor die 410. The second surface 410FS may be a front surface of the lower semiconductor die 410 opposite to the first surface 410BS.

Figure 5:
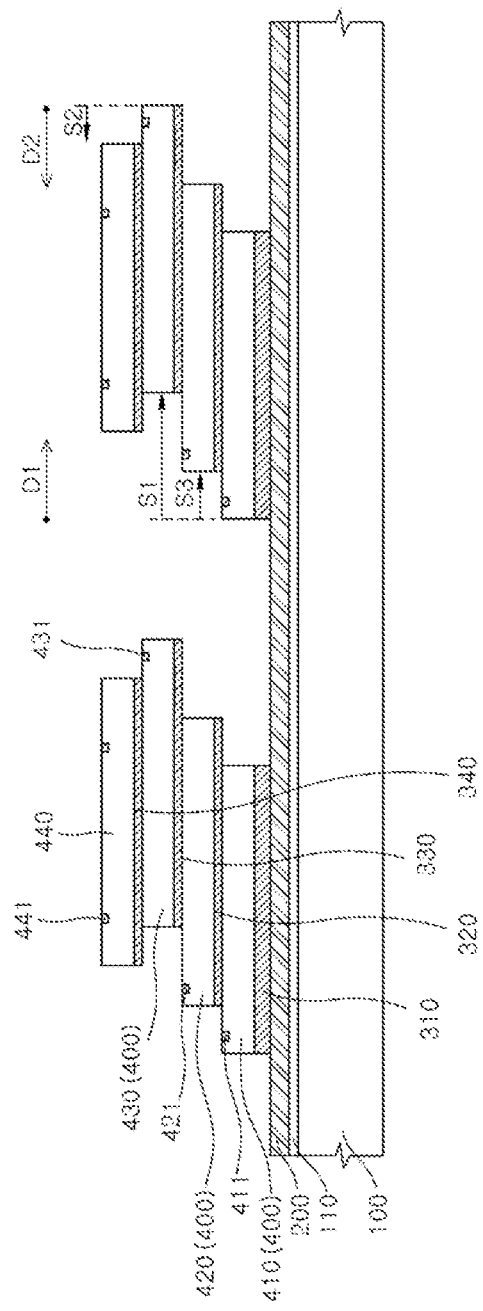

FIG. 5 is a schematic cross-sectional view illustrating stacks of the semiconductor dies 400 of the stack package according to an embodiment of the present disclosure.

Referring to FIG. 5, the semiconductor dies 400 may be sequentially offset stacked on the first encapsulant layer 200. Specifically, the lower semiconductor dies 410 may be disposed on the first encapsulant layer 200, and a second intermediate semiconductor die 420, a first intermediate semiconductor die 430, and an upper semiconductor die 440 may be sequentially stacked on each of the lower semiconductor dies 410. Additional semiconductor dies may be stacked between the upper semiconductor die 440 and the lower semiconductor die 410. Second adhesive layers 320 may attach each of the second intermediate semiconductor dies 420 to each of the lower semiconductor dies 410. Third adhesive layers 330 may attach each of the first intermediate semiconductor dies 430 to each of the second intermediate semiconductor dies 420. Fourth adhesive layers 340 may attach each of the upper semiconductor dies 440 to each of the first intermediate semiconductor dies 430.

The first intermediate semiconductor die 430 may be stacked with a first offset on the lower semiconductor die 410. The first intermediate semiconductor die 430 may be shifted by a first distance S1 in a first offset direction D1 from a position where the lower semiconductor die 410 is disposed.

The first intermediate semiconductor die 430 may partially overlap with the second intermediate semiconductor die 420 while exposing a second contact pad 421 of the second intermediate semiconductor die 420. The first intermediate semiconductor die 430 may partially overlap with the lower semiconductor die 410.

The upper semiconductor die 440 may be stacked with a second offset on the first intermediate semiconductor die 430 in a second offset direction D2 opposite to the first offset direction D1. The upper semiconductor die 440 may be shifted by a second distance S2 in the second offset direction D2 from a position where the first intermediate semiconductor die 430 is stacked. The upper semiconductor die 440 may partially overlap with the first intermediate semiconductor die 430 while exposing a third contact pad 431 of the first intermediate semiconductor die 430. The upper semiconductor die 440 may be positioned to expose a portion of the second intermediate semiconductor die 420 while exposing a portion of the first intermediate semiconductor die 430. The upper semiconductor die 440 may be positioned to expose the second contact pad 421 of the second intermediate semiconductor die 420 while exposing the third contact pad 431 of the first intermediate semiconductor die 430. The upper semiconductor die 440 may include a fourth contact pad 441 on an upper surface.

The second intermediate semiconductor die 420 may be stacked with a third offset between the lower semiconductor die 410 and the first intermediate semiconductor die 430 in a direction substantially the same as the first offset direction D1. The second intermediate semiconductor die 420 may be shifted by a third distance S3 in the first offset direction D1 from the position where the lower semiconductor die 410 is disposed. The third distance S3 may be shorter than the first distance S1. The second distance S2 may be substantially the same as the third distance S3. The second intermediate semiconductor die 420 may partially overlap with the lower semiconductor die 410 while exposing the first contact pad 411 of the lower semiconductor die 410.

As the upper semiconductor die 440 is stacked with the second offset in the second offset direction D2 opposite to the first offset direction D1 of the first and second intermediate semiconductor dies 430 and 420, the overall width of the stack of semiconductor dies 400 may be reduced compared to a stack in which the upper semiconductor die 440 is offset stacked in the first offset direction D1 in the same manner as the first and second intermediate semiconductor dies 430 and 420. Accordingly, it is possible to reduce the width of the stack package.

Figure 6:
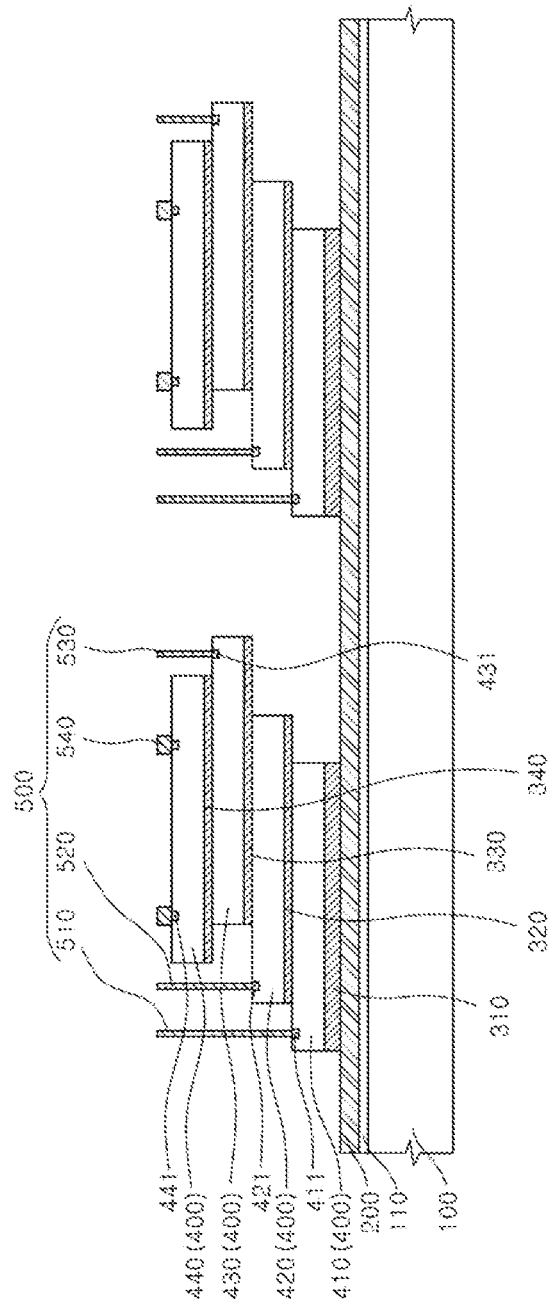

FIG. 6 is a schematic cross-sectional view illustrating a step of forming vertical connectors 500 of the stack package according to an embodiment of the present disclosure.

Referring to FIG. 6, after forming the stacks of the semiconductor dies 400, vertical connectors 500 respectively connected to the semiconductor dies 400 may be formed. Each of the vertical connectors 500 may include a conductive material and may provide paths through which electrical signals are connected to the semiconductor dies 400. Each of the vertical connectors 500 may include a conductive metal material such as gold (Au) or copper (Cu). The vertical connectors 500 may include interconnection members extending substantially vertically from the surfaces of the semiconductor dies 400 or standing substantially perpendicular to the surfaces of the semiconductor dies 400.

Each of the vertical connectors 500 may include a first bonding wire 510, a second bonding wire 530, a third bonding wire 520, and conductive bumps 540. The first bonding wire 510 may be connected to the lower semiconductor die 410 and may be formed to extend substantially vertically while passing next to the second intermediate semiconductor die 420, the first intermediate semiconductor die 430, and the upper semiconductor die 440. The second bonding wire 530 may be connected to the first intermediate semiconductor die 430 and may be formed to extend substantially vertically while passing next to the upper semiconductor die 440. The first bonding wire 510 and the second bonding wire 530 may be formed at positions opposite to each other with the upper semiconductor die 440 interposed therebetween. The third bonding wire 520 may be connected to the second intermediate semiconductor die 420 and may be formed to extend substantially vertically while passing next to the first intermediate semiconductor die 430 and the upper semiconductor die 440.

Each of the bonding wires 510, 530, and 520 may be formed by a wire bonding process using a wire bonding apparatus (not illustrated).

Figure 7:
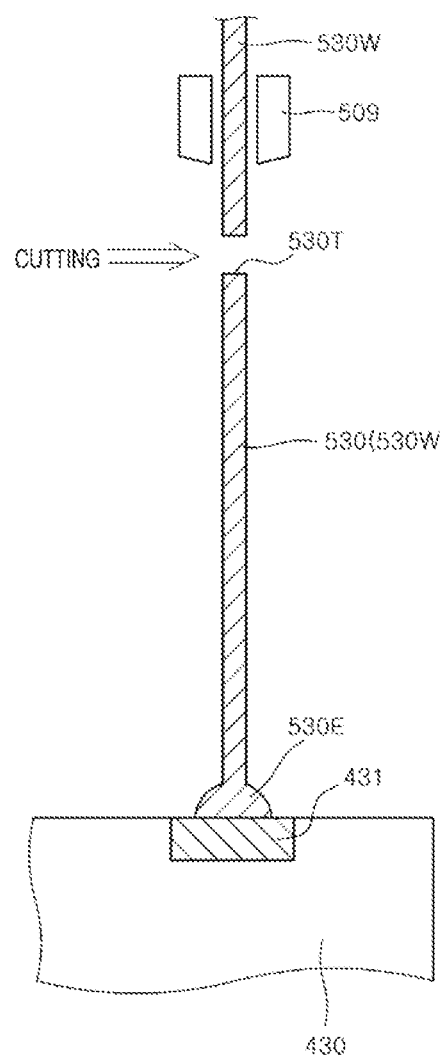

FIG. 7 is a schematic cross-sectional view illustrating a step of forming the second bonding wire 530 of the stack package according to an embodiment of the present disclosure.

Referring to FIG. 7, a capillary 509 of the wire bonding apparatus may move to guide a wire 530W to be positioned over the third contact pad 431 of the first intermediate semiconductor die 430. The capillary 509 may be lowered so that a first end 530E of the wire 530W may be bonded to the third contact pad 431. Thereafter, the second bonding wire 530 may be substantially vertically extended from the bonded first end 530E by raising the capillary 509, and the second bonding wire 530 may be cut and separated from the wire 530W. Accordingly, the second bonding wire 530 may be formed as a vertical connection member having the first end 530E and a second end 530T opposite to the first end 530E. Through such a wire bonding process, the second bonding wire 530 connected substantially vertically to the first intermediate semiconductor die 430 may be formed. By applying such a wire bonding process, as illustrated in FIG. 6, the first and third bonding wires 510 and 520 may also be formed.

Referring to FIG. 6 again, the step of forming the vertical connectors 500 may further include a step of forming the conductive bumps 540 connected to the upper semiconductor die 440. Bonding wire 530W might not be connected to the upper semiconductor die 440, and the conductive bumps 540 may be formed on fourth contact pads 441, respectively, using a bump forming process. Each of the conductive bumps 540 may be formed of a copper (Cu) material. In another embodiment, bonding wires (not illustrated) bonded to the fourth contact pads 441 may be formed. The bonding wires may be introduced as connection members for replacing the conductive bumps 540.

Figure 8:
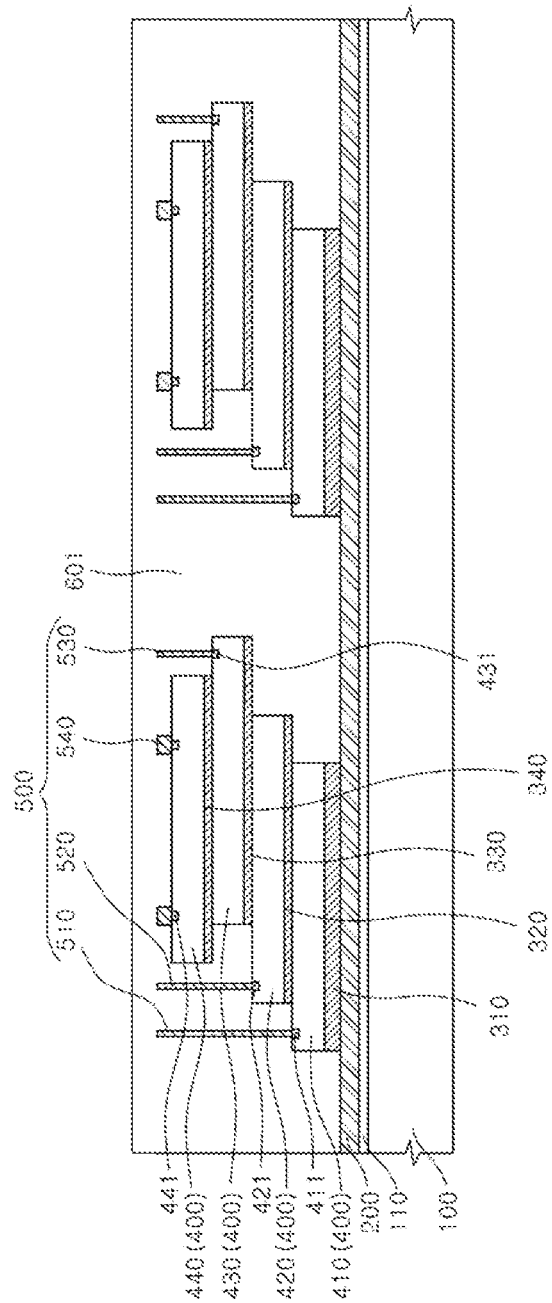

FIG. 8 is a schematic cross-sectional view illustrating a step of forming a second encapsulant layer 601 of the stack package according to an embodiment of the present disclosure.

Referring to FIG. 8, the second encapsulant layer 601 may be formed to cover and encapsulate the stacked semiconductor dies 400. The second encapsulant layer 601 may be formed to cover the exposed surface portions of the first encapsulant layer 200 and be coupled to the first encapsulant layer 200. The first encapsulant layer 200 and the second encapsulant layer 601 may be coupled to encapsulate the stacked semiconductor dies 400 as a whole. The second encapsulant layer 601 may be formed by a molding process using a liquid encapsulant material. The molding process may be performed by mounting the carrier 100 on which the semiconductor dies 400 are stacked in a mold (not illustrated), introducing the liquid encapsulant material into the mold, pressing the mold, and curing the introduced encapsulant material. The second encapsulant layer 601 may be molded from a liquid epoxy molding compound (EMC). The epoxy molding compound (EMC) constituting the second encapsulant layer 601 may have substantially the same component and composition ratio as the EMC constituting the first encapsulant layer 200. The epoxy molding compound (EMC) constituting the second encapsulant layer 601 may have a component and composition ratio different from those of the EMC constituting the first encapsulant layer 200.

Figure 9:
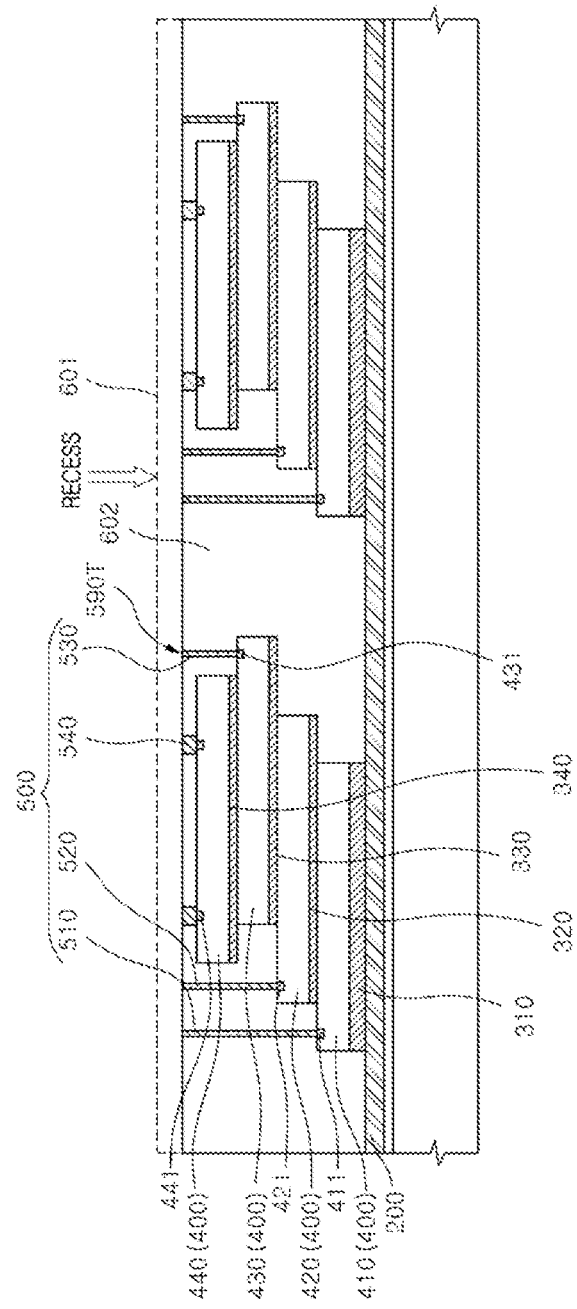

FIG. 9 is a schematic cross-sectional view illustrating a step of recessing the second encapsulant layer 601 of the stack package according to an embodiment of the present disclosure.

Referring to FIG. 9, a portion of the second encapsulant layer 601 may be removed. The second encapsulant layer 601 may be recessed to form a second encapsulant layer 602. The portion of the second encapsulant layer 601 may be removed by grinding an upper surface of the second encapsulant layer 601. End portions of the vertical connectors 500 may be exposed at a surface of the second encapsulant layer 602. For example, the second encapsulant layer 602 may be recessed so that a second end 530T of the second bonding wire 530 is exposed.

While the second encapsulant layer 601 and the semiconductor dies 400 are attached to the carrier 100, a grinding process of recessing the second encapsulant layer 601 may be performed. Because the second encapsulant layer 601 and the semiconductor dies 400 are attached to the carrier 100, the warpage phenomenon of the structure including the second encapsulant layer 602 and the semiconductor dies 400 may be substantially prevented or reduced. As described, because the warpage phenomenon is substantially suppressed, the thickness variation of the recessed second encapsulant layer 602 may be substantially reduced. Accordingly, process defects that may be caused by the warpage phenomenon may be effectively prevented or suppressed.

Figure 10:
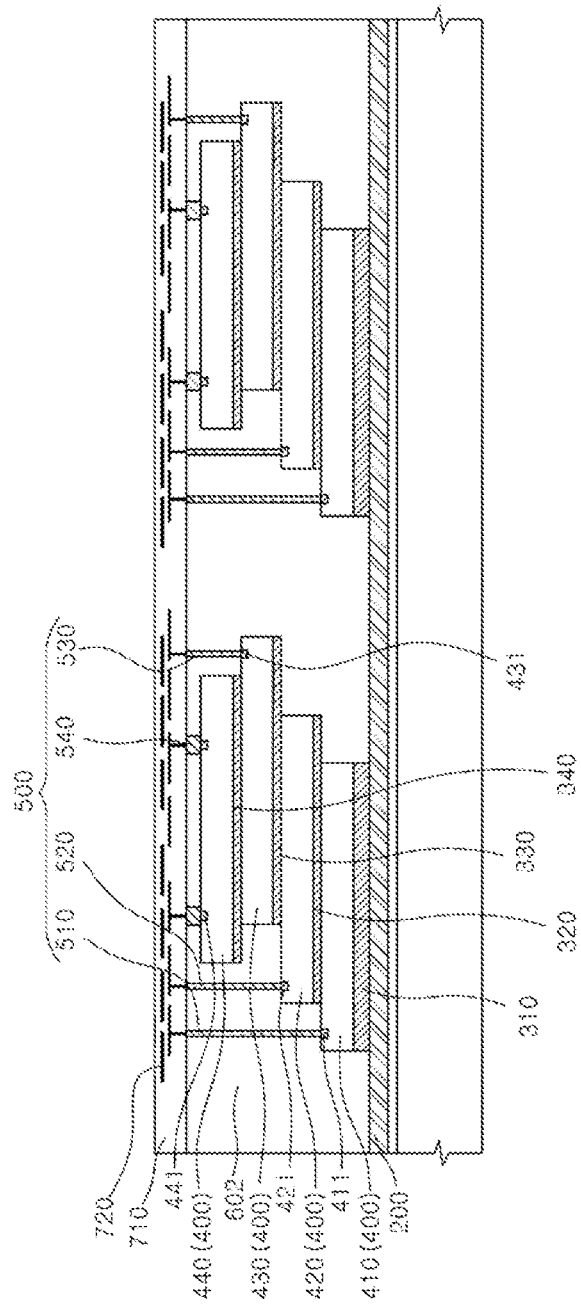

FIG. 10 is a schematic cross-sectional view illustrating a step of forming redistribution layers 720 of the stack package according to an embodiment of the present disclosure.

Referring to FIG. 10, the redistribution layers 720 may be formed over the second encapsulant layer 602. The redistribution layers 720 may be formed as conductive patterns electrically and signally connected to the vertical connectors 500. The redistribution layers 720 may be formed as circuit wirings connected to the semiconductor dies 400 through the vertical connectors 500. The redistribution layers 720 may be insulated from each other by a dielectric layer 710. The redistribution layers 720 may constitute an interconnection structure such as a printed circuit board (PCB). The redistribution layers 720p may provide a thinner interconnection structure than a printed circuit board (PCB) structure. Accordingly, it is possible to reduce the overall thickness of the stack package as compared to the stack package including the printed circuit board (PCB).

Figure 11:
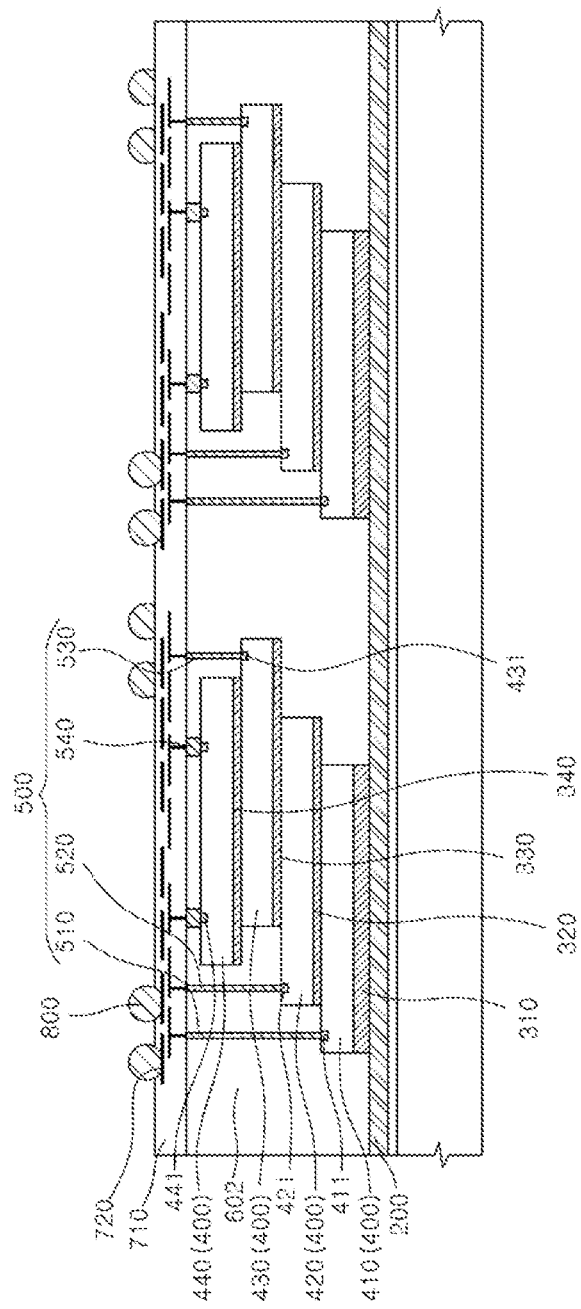

FIG. 11 is a schematic cross-sectional view illustrating a step of forming outer connection terminals 800 of the stack package according to an embodiment of the present disclosure.

Referring to FIG. 11, the outer connection terminals 800 electrically connected to the redistribution layers 720 may be formed. Each of the outer connection terminal 800 may have a shape of a solder ball.

Figure 12:
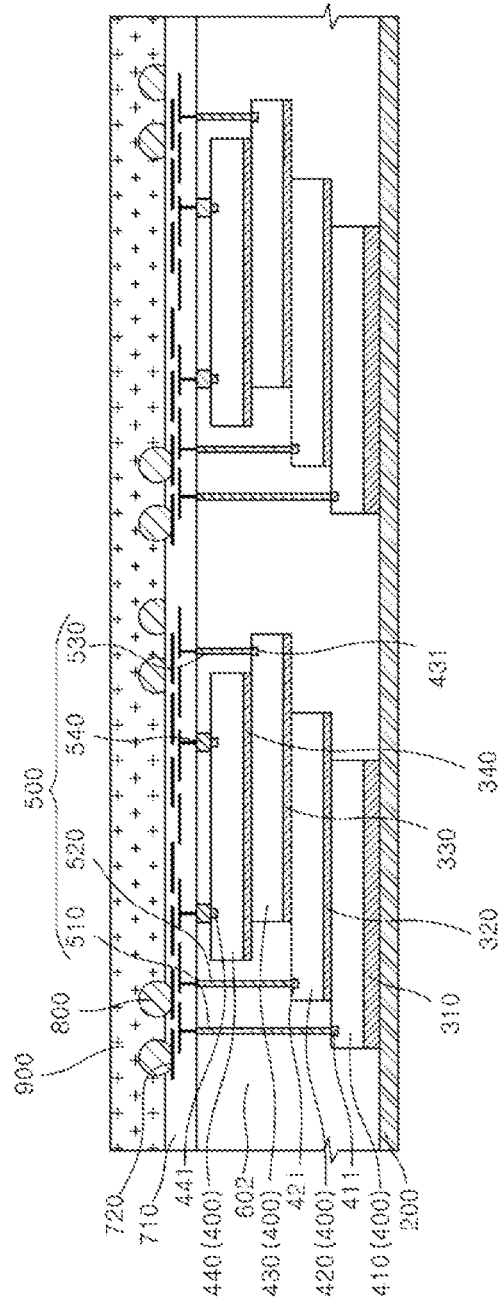

FIG. 12 is a schematic cross-sectional view illustrating a step of removing the carrier 100 of the stack package according to an embodiment of the present disclosure.

Referring to FIGS. 12 and 11, a protective layer 900 encapsulating the outer connection terminals 800 may be formed. The protective layer 900 may be formed by attaching a film including an adhesive to the dielectric layer 710 encapsulating the redistribution layers 720. The first encapsulant layer 200 may be exposed by removing the carrier 100.

Figure 13:
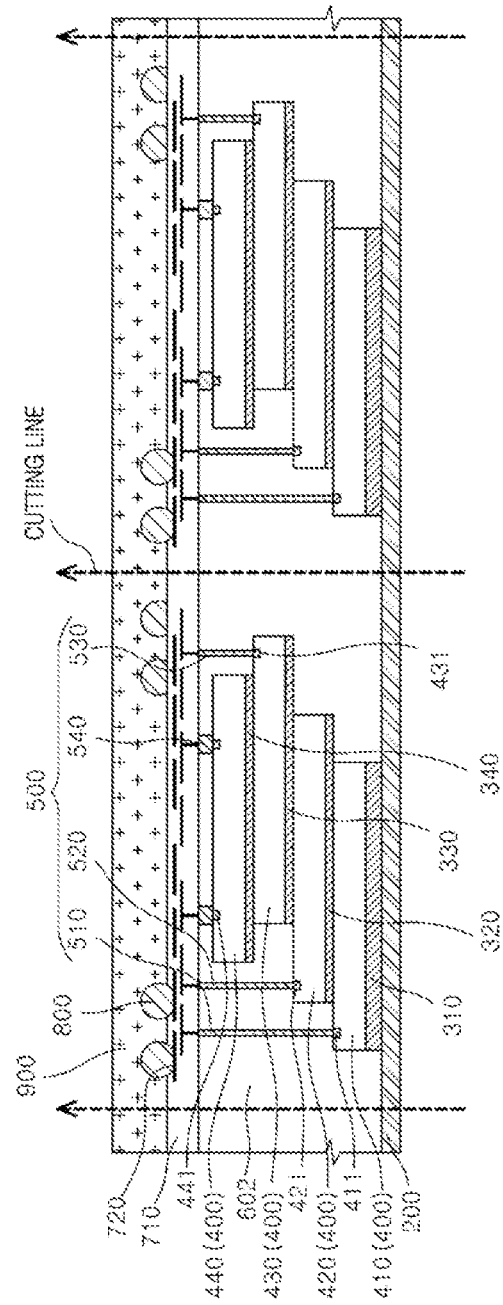
Figure 14:
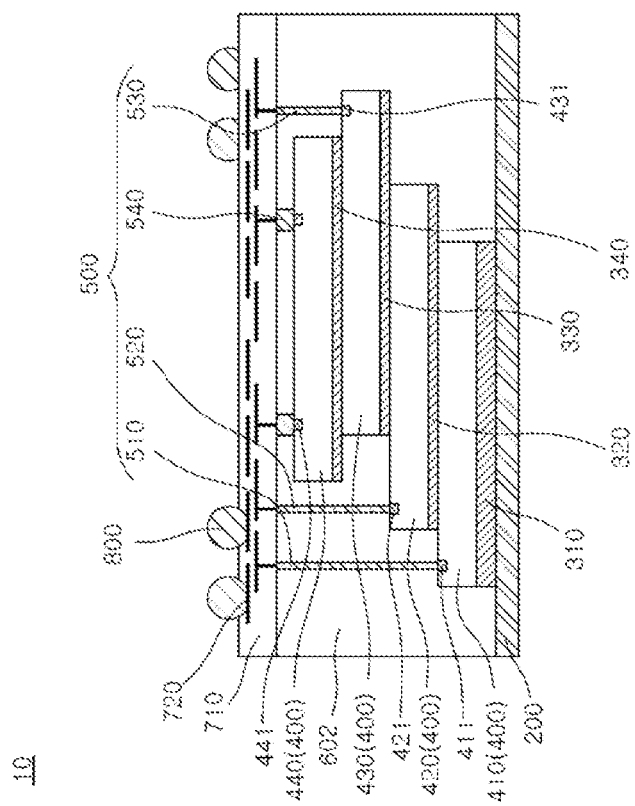

FIG. 13 is a schematic cross-sectional view illustrating a singulation step of the stack package according to an embodiment of the present disclosure. FIG. 14 is a schematic cross-sectional view illustrating a cross-sectional shape of the singulated stack package according to an embodiment of the present disclosure.

Referring to FIG. 13, another carrier (not illustrated) may be attached to the protective layer 900 and a sawing process of cutting the stack package along a cutting line may be performed. In the sawing process, a portion of the dielectric layer 710, a portion of the second encapsulant layer 602, and a portion of the first encapsulant layer 200 may be removed using a sawing blade (not illustrated). In the sawing process, the portion of the dielectric layer 710, the portion of the second encapsulant layer 602, and the portion of the first encapsulant layer 200 may be removed using a laser. The sawing process may be performed as a stealth dicing process. After the sawing process, the protective layer 900 may be removed from a single stack package 10. Accordingly, as illustrated in FIG. 14, the single stack package 10 may be separated.

FIGS. 15 to 21 are schematic cross-sectional views illustrating process steps of a method of manufacturing a stack package according to another embodiment of the present disclosure. In FIGS. 15 to 21, members depicted in shapes similar to or substantially the same as the shapes illustrated in FIGS. 1 to 14 may be understood as indicating substantially the same members.

Figure 15:
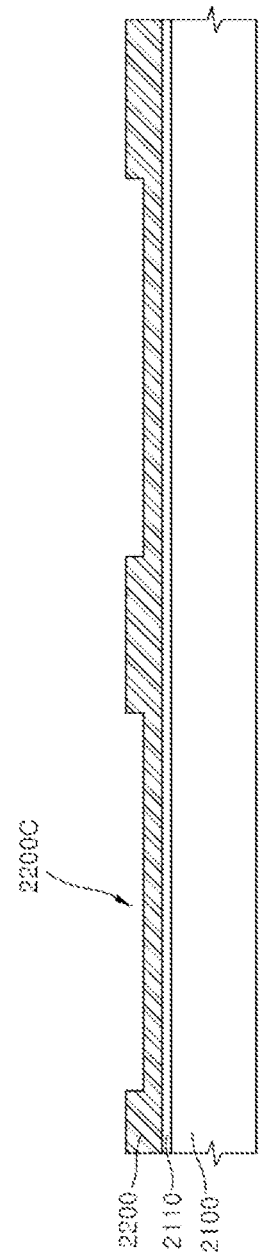
FIGS. 15 to 21 are schematic cross-sectional views illustrating a stack package and a method of fabricating the same according to another embodiment of the present disclosure.

FIG. 15 is a schematic cross-sectional view illustrating a step of forming a first encapsulant layer 2200 of the stack package according to an embodiment of the present disclosure.

Referring to FIG. 15, the first encapsulant layer 2200 may be formed on a carrier 2100. Specifically, a first encapsulant film as the first encapsulant layer 2200 may be laminated on the carrier 2100 by a carrier adhesive layer 2110. Concave cavities 2200C may be provided on a surface of the first encapsulant layer 2200. The first encapsulant film having the cavities 2200C thereon may be laminated on the carrier 2100 as the first encapsulant layer 2200. In another embodiment, the cavities 2200C may be formed in the first encapsulant layer 2200 by removing a portion of the first encapsulant layer 2200 after forming the first encapsulant layer 2200. The cavities 2200C may be formed at positions where lower semiconductor dies 2410 of FIG. 16 are to be disposed so that the lower semiconductor dies 2410 of FIG. 16 may be inserted into the cavities 2200C in a subsequent process step.

Figure 16:
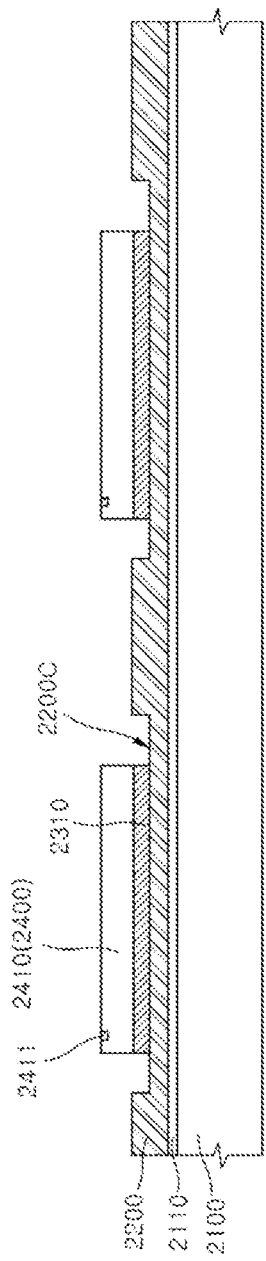

FIG. 16 is a schematic cross-sectional view illustrating a step of disposing lower semiconductor dies 2410 of the stack package according to an embodiment of the present disclosure.

Referring to FIG. 16, the lower semiconductor dies 2410 may be disposed on the first encapsulant layer 2200. The lower semiconductor dies 2410 may be disposed in the cavities 2200C of the first encapsulant layer 2200. Each of the lower semiconductor dies 2410 may be disposed on the first encapsulant layer 2200 so that a portion or the whole of the lower semiconductor die 2410 is inserted into each of the cavities 2200C of the first encapsulant layer 2200. The cavities 2200C of the first encapsulant layer 2200 may be used as marks indicating positions where the lower semiconductor dies 2410 are to be disposed, so that the lower semiconductor dies 2410 may be disposed at more accurate positions when the lower semiconductor dies 2410 are disposed on the first encapsulant layer 2200. Because the cavities 2200C provide a convex surface structure on the surface of the first encapsulant layer 2200, the first encapsulant layer 2200 may have higher resistance to warpage. Accordingly, during the subsequent process for forming the stack package, it is possible to effectively suppress or reduce the occurrence of warpage.

The lower semiconductor dies 2410 may be attached to bottoms of the cavities 2200C of the first encapsulant layer 2200 by first adhesive layers 2310. Each of the lower semiconductor dies 2410 may include a first contact pad 2411 on its surface.

Figure 17:
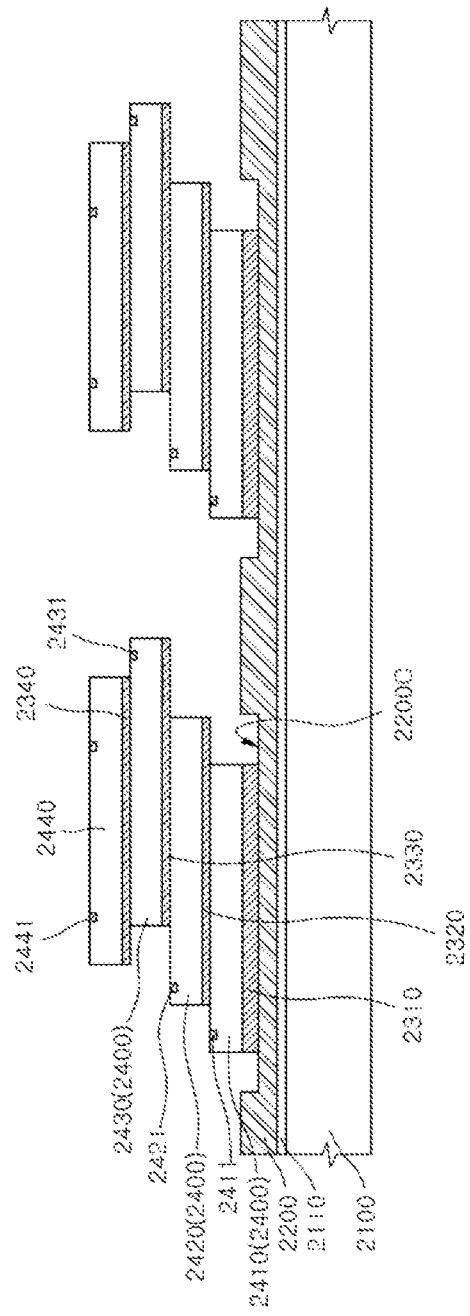

FIG. 17 is a schematic cross-sectional view illustrating stacks of the semiconductor dies 2400 of the stack package according to an embodiment of the present disclosure.

Referring to FIG. 17, the semiconductor dies 2400 may be sequentially offset stacked on the first encapsulant layer 2200. The lower semiconductor dies 2410 may be disposed on the first encapsulant layer 2200, and second intermediate semiconductor dies 2420, first intermediate semiconductor dies 2430, and upper semiconductor dies 2440 may be sequentially stacked on the lower semiconductor dies 2410. Additional semiconductor dies may be stacked between the upper semiconductor dies 2440 and the lower semiconductor dies 2410. A second adhesive layer 2320 may attach the second intermediate semiconductor die 2420 to the lower semiconductor die 2410. A third adhesive layer 2330 may attach the first intermediate semiconductor die 2430 to the second intermediate semiconductor die 2420. A fourth adhesive layer 2340 may attach the upper semiconductor die 2440 to the first intermediate semiconductor die 2430.

Each of the first intermediate semiconductor dies 2430 may be stacked with a first offset in a first offset direction on the lower semiconductor die 2410. The first intermediate semiconductor die 2430 may partially overlap with the second intermediate semiconductor dies 2420 while exposing a second contact pad 2421 of the second intermediate semiconductor die 2420. The first intermediate semiconductor die 2430 may partially overlap with the lower semiconductor die 2410. The upper semiconductor die 2440 may be stacked with a second offset on the first intermediate semiconductor die 2430 in a direction opposite to the first offset direction. The upper semiconductor die 2440 may partially overlap with the first intermediate semiconductor die 2430 while exposing a third contact pad 2431 of the first intermediate semiconductor die 2430. The upper semiconductor die 2440 may include fourth contact pads 2441 on an upper surface.

The second intermediate semiconductor die 2420 may be stacked with a third offset between the lower semiconductor die 2410 and the first intermediate semiconductor die 2430 in a direction substantially the same as the first offset direction. The second intermediate semiconductor die 2420 may partially overlap with the lower semiconductor die 2410 while exposing the first contact pad 2411 of the lower semiconductor die 2410.

Figure 18:
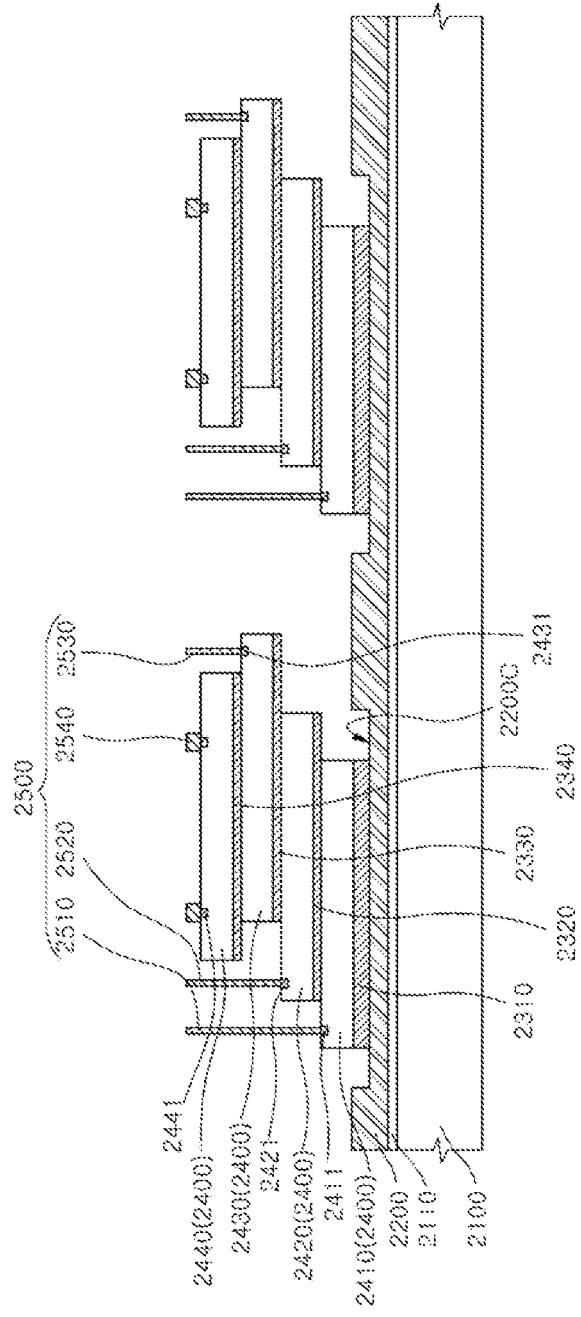

FIG. 18 is a schematic cross-sectional view illustrating a step of forming vertical connectors 2500 of the stack package according to an embodiment of the present disclosure.

Referring to FIG. 18, after the stacks of the semiconductor dies 2400 are formed, the vertical connectors 2500 respectively connected to the semiconductor dies 2400 may be formed. Each of the vertical connectors 2500 may include a first bonding wire 2510, a second bonding wire 2530, a third bonding wire 2520, and conductive bumps 2540.

Figure 19:
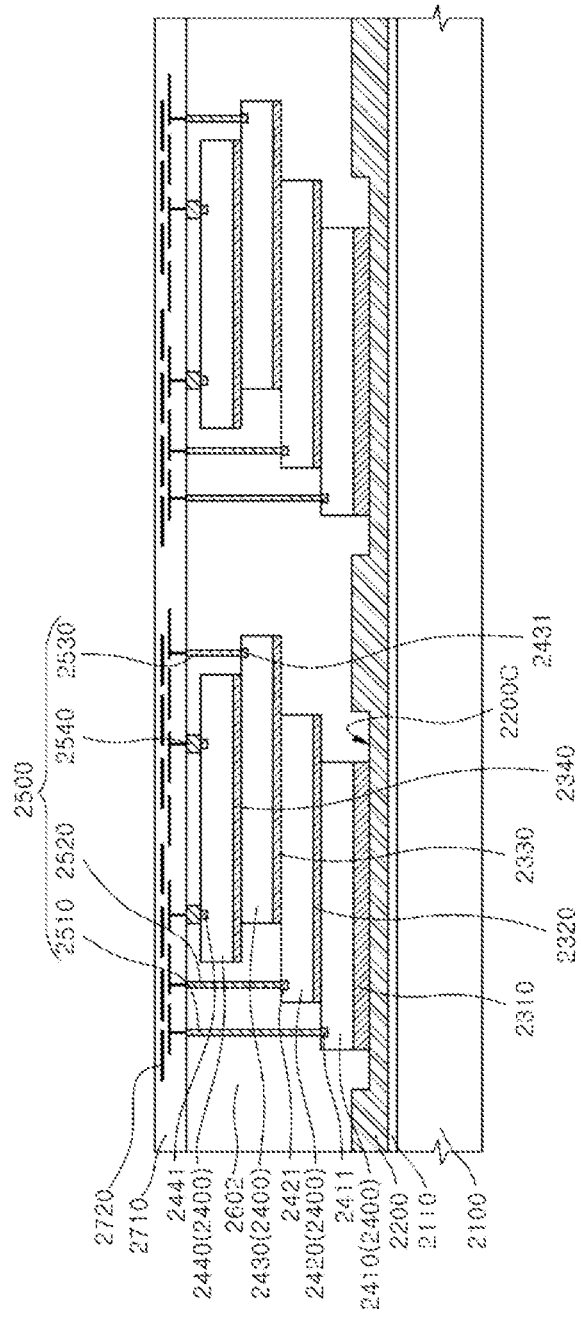

FIG. 19 is a schematic cross-sectional view illustrating a step of forming redistribution layers 2720 of the stack package according to an embodiment of the present disclosure.

Referring to FIG. 19, a second encapsulant layer 2602 may be formed to cover and encapsulate the stacked semiconductor dies 2400. The redistribution layers 2720 may be formed over the second encapsulant layer 602. The redistribution layers 2720 may be embedded in a dielectric layer 2710. The redistribution layers 2720 may be formed as conductive patterns electrically and signally connected to the vertical connectors 2500.

Figure 20:
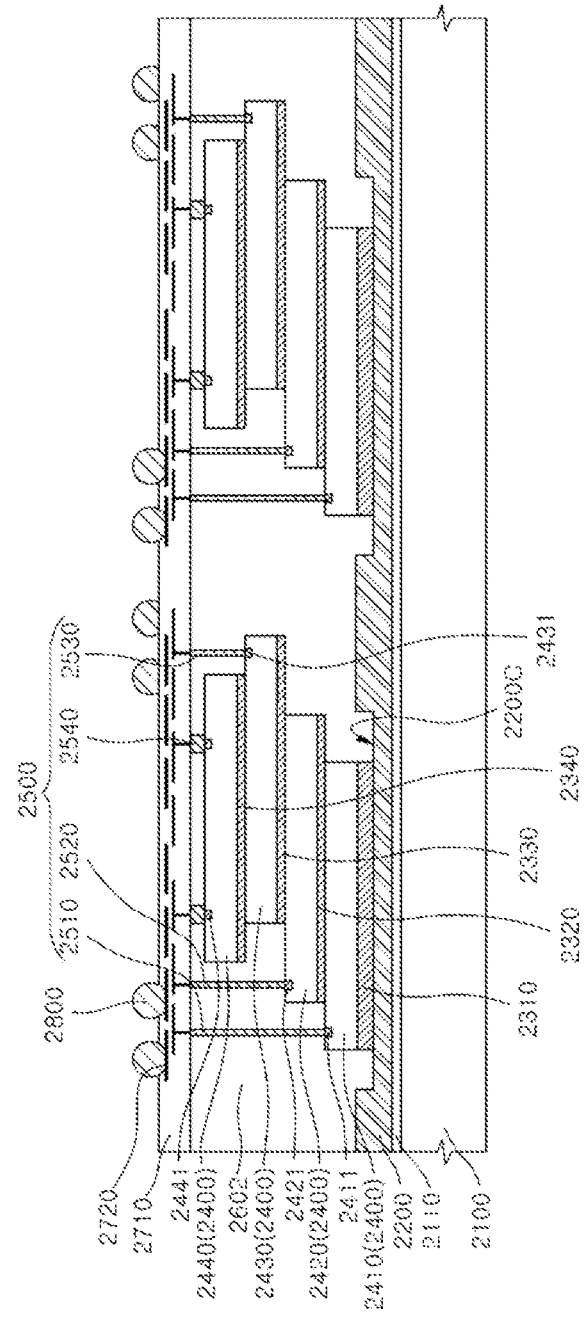

FIG. 20 is a schematic cross-sectional view illustrating a step of forming outer connection terminals 2800 of the stack package according to an embodiment of the present disclosure.

Referring to FIG. 20, the outer connection terminals 2800 electrically connected to the redistribution layers 2720 may be formed.

Figure 21:
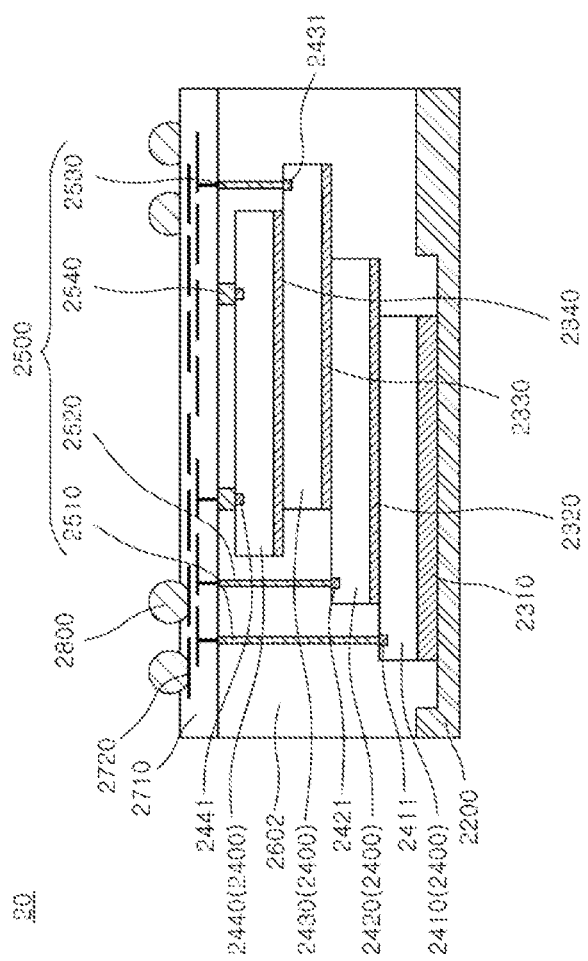

FIG. 21 is a schematic cross-sectional view illustrating a shape of a single stack package 20 according to an embodiment of the present disclosure.

Referring to FIGS. 21 and 20, the first encapsulant layer 2200 may be exposed by removing the carrier 2100. Thereafter, a sawing process may be performed to singulate the stack package 20.

Referring to FIG. 14 again, the stack package 10 according to an embodiment may include the semiconductor dies 400 that are sequentially offset stacked on the first encapsulant layer 200. The stack package 10 may further include the second encapsulant layer 602 coupled to the first encapsulant layer 200 while encapsulating the semiconductor dies 400. The stack package 10 may include the redistribution layers 720 formed on the second encapsulant layer 602 and the vertical connectors 500 passing through the second encapsulant layer 602 while connecting semiconductor dies 400 to the redistribution layers 720.

Referring to FIG. 21 again, the stack package 20 according to an embodiment may include the first encapsulant layer 2200, the semiconductor dies 2400, the second encapsulant layer 2602, the redistribution layers 2720, and the vertical connectors 2500. The cavity 2200C into which the lower semiconductor die 2410 is partially inserted may be provided in the first encapsulant layer 2200.

As described above, according to some embodiments of the present disclosure, there may be provided a stack package structure and a manufacturing method, in which a plurality of semiconductor dies are offset stacked with each other and the stacked semiconductor dies and redistribution layers are connected by vertical connectors.

Figure 22:
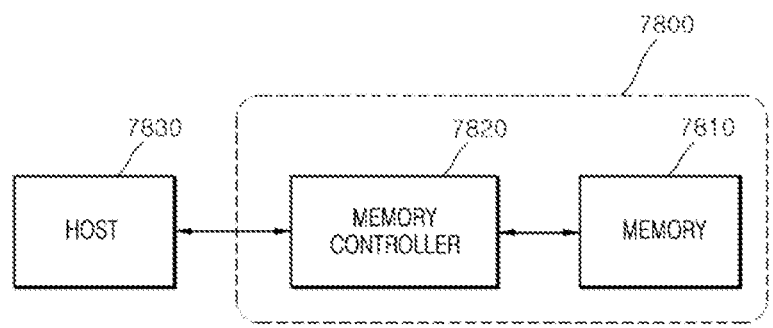
FIG. 22 is a block diagram illustrating an electronic system employing a memory card including a package according to an embodiment of the present disclosure.

FIG. 22 is a block diagram illustrating an electronic system including a memory card 7800 employing at least one of the semiconductor packages according to an embodiment of the present disclosure. The memory card 7800 includes a memory 7810 such as a nonvolatile memory device, and a memory controller 7820. The memory 7810 and the memory controller 7820 may store data or read out stored data. At least one of the memory 7810 and the memory controller 7820 may include at least one of the semiconductor packages according to the embodiments of the present disclosure.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 23:
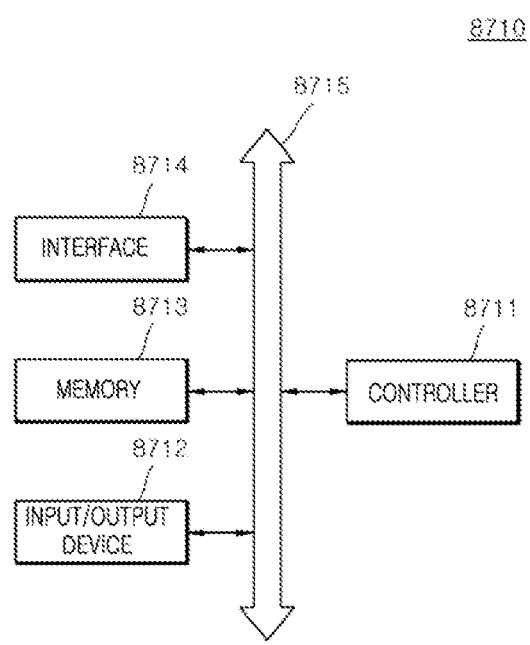
FIG. 23 is a block diagram illustrating an electronic system including a package according to an embodiment of the present disclosure.

FIG. 23 is a block diagram illustrating an electronic system 8710 including at least one of the semiconductor packages according to an embodiment of the present disclosure. The electronic system 8710 may include a controller 8711, an input/output device 8712, and a memory 8713. The controller 8711, the input/output device 8712, and the memory 8713 may be coupled with one another through a bus 8715 providing a path through which data moves.

In an embodiment, the controller 8711 may include one or more of a microprocessor, a digital signal processor, a microcontroller, and/or a logic device capable of performing the same functions as these components. The controller 8711 or the memory 8713 may include at least one of the semiconductor packages according to an embodiment of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The present teachings have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the present teachings is not limited to the above descriptions but defined by the accompanying claims, and all of distinctive features in the equivalent scope should be construed as being included in the present teachings.

What is claimed is:

1. A stack package comprising:
   semiconductor dies offset stacked on a first encapsulant layer;
   a second encapsulant layer coupled to the first encapsulant layer and encapsulating the semiconductor dies;
   redistribution layers formed on the second encapsulant layer; and
   vertical connectors penetrating the second encapsulant layer and connecting the semiconductor dies to the redistribution layers,
   wherein the semiconductor dies include:
   a lower semiconductor die;
   a first intermediate semiconductor die stacked on the lower semiconductor die with a first offset; and
   an upper semiconductor die stacked on the first intermediate semiconductor die with a second offset in an opposite direction to the first offset, and
   wherein the vertical connectors include:
   a first bonding wire connected to the lower semiconductor die and extending substantially vertically past the upper semiconductor die and the first intermediate semiconductor die; and
   a second bonding wire connected to the first intermediate semiconductor die and extending substantially vertically past the upper semiconductor die.

2. The stack package of claim 1, wherein the first encapsulant layer comprises an epoxy molding compound (EMC) film.

3. The stack package of claim 1, wherein the first encapsulant layer includes a cavity into which a lower semiconductor die among the stacked semiconductor dies is disposed.

4. The stack package of claim 1, further comprising an adhesive layer attaching the lower semiconductor die to the first encapsulant layer.

5. The stack package of claim 1, wherein the semiconductor dies further include a second intermediate semiconductor die stacked between the lower semiconductor die and the first intermediate semiconductor die with a third offset in substantially the same direction as the first offset.

6. The stack package of claim 5, wherein the upper semiconductor die is positioned to expose a portion of the second intermediate semiconductor die while exposing a portion of the first intermediate semiconductor die.

7. The stack package of claim 1, wherein the first bonding wire and the second bonding wire are formed at positions opposite to each other with the upper semiconductor die interposed therebetween.

8. The stack package of claim 1, wherein the vertical connectors further include conductive bumps connected to the upper semiconductor die.

* * * * *